US007692291B2

(12) United States Patent
Moon et al.

(10) Patent No.: US 7,692,291 B2
(45) Date of Patent: Apr. 6, 2010

(54) CIRCUIT BOARD HAVING A HEATING MEANS AND A HERMETICALLY SEALED MULTI-CHIP PACKAGE

(75) Inventors: Ho-Jeong Moon, Seoul (KR); Kyu-Jin Lee, Cheonan (KR)

(73) Assignee: Samsung Electronics Co., Ltd., Gyeonggo-do (KR)

( * ) Notice: Subject to any disclaimer, the term of this patent is extended or adjusted under 35 U.S.C. 154(b) by 901 days.

(21) Appl. No.: 10/121,515

(22) Filed: Apr. 12, 2002

(65) Prior Publication Data

US 2002/0158330 A1 Oct. 31, 2002

(30) Foreign Application Priority Data

Apr. 30, 2001 (KR) ................ 2001-23350

(51) Int. Cl.
*H01L 23/02* (2006.01)
*H01L 23/12* (2006.01)
*H01L 23/10* (2006.01)
*H01L 23/28* (2006.01)

(52) U.S. Cl. ............ 257/707; 257/686; 257/706; 257/E23.103

(58) Field of Classification Search ......... 257/718–720, 257/706, 712, 675, 796, 722, 707, 723, 704, 257/705; 361/704, 705, 737
See application file for complete search history.

(56) References Cited

U.S. PATENT DOCUMENTS 3,289,046 A * 11/1966 Carr .............. 361/772
4,092,697 A * 5/1978 Spaight ............ 361/718
4,101,970 A * 7/1978 Saito et al. ........... 365/2
4,123,293 A * 10/1978 Okikawa et al. ...... 228/123.1
4,143,468 A * 3/1979 Novotny et al. .......... 34/276
4,524,238 A * 6/1985 Butt .................. 174/52.4
4,561,006 A * 12/1985 Currie ............... 257/697
4,609,903 A * 9/1986 Toyokura et al. ..... 338/22 SD
4,730,232 A 3/1988 Lindberg ............ 361/381
4,771,365 A * 9/1988 Cichocki et al. ........ 361/705
4,833,567 A * 5/1989 Saaski et al. ........... 361/700
4,860,444 A * 8/1989 Herrell et al. ............ 29/840
5,010,233 A * 4/1991 Henschen et al. ........ 219/209

(Continued)

FOREIGN PATENT DOCUMENTS

JP 60-30155 2/1985

(Continued)

*Primary Examiner*—Matthew C Landau
*Assistant Examiner*—James M Mitchell
(74) *Attorney, Agent, or Firm*—Harness, Dickey & Pierce, P.L.C.

(57) ABSTRACT

A circuit board having heating elements and a hermetically sealed multi-chip package. The multi-chip package includes a plurality of semiconductor chips, a substrate electrically coupled to the plurality of semiconductor chips, heat dissipation means, and a plurality of thermal interfaces disposed between the semiconductor chips and the heat dissipation means. The heat dissipation means forms a hermetically sealed cavity that encloses the semiconductor chips and at least a portion of the substrate. The circuit board includes a chip mounting surface, a chip mounting area on the chip mounting surface, the chip mounting area including a plurality of lands, and heating elements connected to the lands, the heating elements capable heating a joint formed between the lands and electrode pads of a semiconductor chip.

19 Claims, 5 Drawing Sheets

U.S. PATENT DOCUMENTS

| | | | | |
|---|---|---|---|---|
| 5,109,317 | A * | 4/1992 | Miyamoto et al. | 361/715 |
| 5,109,318 | A * | 4/1992 | Funari et al. | 361/710 |
| 5,199,164 | A * | 4/1993 | Kim et al. | 29/840 |
| 5,222,014 | A * | 6/1993 | Lin | 361/792 |
| 5,265,321 | A * | 11/1993 | Nelson et al. | 29/841 |
| 5,268,814 | A * | 12/1993 | Yakubowski | 361/704 |
| 5,323,292 | A * | 6/1994 | Brzezinski | 361/689 |
| 5,377,077 | A * | 12/1994 | Burns | 361/704 |
| 5,396,403 | A | 3/1995 | Patel | 361/705 |
| 5,541,448 | A * | 7/1996 | Carpenter | 257/679 |
| 5,587,882 | A * | 12/1996 | Patel | 361/705 |
| 5,703,398 | A * | 12/1997 | Sono et al. | 257/706 |
| 5,750,926 | A * | 5/1998 | Schulman et al. | 174/52.3 |
| 5,856,913 | A | 1/1999 | Heilbronner | 361/760 |
| 5,951,893 | A * | 9/1999 | Bitko et al. | 219/209 |
| 5,963,427 | A * | 10/1999 | Bollesen | 361/704 |
| 5,981,310 | A | 11/1999 | DiGiacomo et al. | 438/106 |
| 6,051,888 | A * | 4/2000 | Dahl | 257/778 |
| 6,128,194 | A * | 10/2000 | Francis | 361/737 |
| 6,143,590 | A * | 11/2000 | Ohki et al. | 438/122 |
| 6,169,325 | B1 * | 1/2001 | Azuma et al. | 257/685 |
| 6,233,154 | B1 * | 5/2001 | Farnworth et al. | 361/752 |
| 6,281,573 | B1 * | 8/2001 | Atwood et al. | 257/706 |
| 6,320,257 | B1 * | 11/2001 | Jayaraj et al. | 257/723 |
| 6,351,384 | B1 * | 2/2002 | Daikoku et al. | 361/704 |
| 6,362,966 | B1 * | 3/2002 | Ali et al. | 361/728 |
| 6,373,133 | B1 * | 4/2002 | DiGiacomo et al. | 257/713 |
| 6,411,507 | B1 * | 6/2002 | Akram | 361/690 |
| 6,437,240 | B2 * | 8/2002 | Smith | 174/52.2 |
| 6,438,504 | B2 * | 8/2002 | Mikubo et al. | 702/132 |
| 6,442,033 | B1 * | 8/2002 | Liu et al. | 361/743 |
| 6,478,944 | B1 * | 11/2002 | Ishiyama | 205/102 |
| 6,483,702 | B1 * | 11/2002 | Lofland | 361/704 |
| 6,785,144 | B1 * | 8/2004 | Akram | 361/749 |
| 2001/0000988 | A1 * | 5/2001 | Farnworth et al. | 361/740 |
| 2001/0005311 | A1 * | 6/2001 | Duesman et al. | 361/703 |
| 2001/0009504 | A1 * | 7/2001 | Lee et al. | 361/729 |

FOREIGN PATENT DOCUMENTS

| | | | |
|---|---|---|---|
| JP | 61-294842 | * | 12/1986 |
| JP | 01185957 | * | 7/1989 |
| JP | 5-326768 | * | 12/1993 |
| JP | 06104353 | * | 4/1994 |
| JP | 06-268113 | * | 9/1994 |
| JP | 7-115153 | | 5/1995 |
| JP | 7-176651 | | 7/1995 |
| JP | 7-211831 | | 8/1995 |
| JP | 8-125113 | | 5/1996 |
| JP | 9-148500 | | 6/1997 |
| JP | 10-340983 | * | 12/1998 |
| WO | WO90/16141 | * | 12/1990 |

* cited by examiner

CIRCUIT BOARD HAVING A HEATING MEANS AND A HERMETICALLY SEALED MULTI-CHIP PACKAGE

BACKGROUND OF THE INVENTION

1. Field of the Invention

This invention relates to a circuit board having a heating means and a hermetically sealed multi-chip package.

2. Related Art

Recently, a wide variety of smaller and lighter mobile electronic devices have been developed. Such mobile electronic devices include cellular phones, digital video/still cameras, PDAs (Personal Digital Assistants), HPCs (Handheld Personal Computers), MP3 (MPEG-1 Audio Layer-3) players and notebook computers. Semiconductor packages that include semiconductor devices (or chips) are typically mounted within these mobile electronic devices. To fit inside of a small mobile electronic device, the size of the semiconductor packages must be approximately equal to the size of the semiconductor chips that are housed within the semiconductor packages.

This CSP (Chip Size Package or Chip Scale Package), which is a package that is approximately the equal to the size of the semiconductor chips that are housed within the package, was developed in 1990s. In particular, the CSP was introduced in the semiconductor packaging industry in 1992. Since then, various types of CSPs have been developed by LSI manufacturers. The most popular CSP is the Fine pitch Ball Grid Array (FBGA), which is widely used for memory and logic chips. In addition, Bump Chip Carrier (BCC), Face Down-FBGA (FD-FBGA), Super-CSP, and Fine pitch Land Grid Array (FLGA) packages have been developed.

In a CSP, the reliability of its solder joints is one of most important technical issues. To evaluate CSPs, thermal cycling tests and mechanical strength tests are used. CSPs are mounted to a circuit board via solder balls or solder bumps, and hence CSP solder joints can be viewed as solder joints of flip-chip devices. The reliability of the solder joints in flip-chip and CSP assemblies is strongly affected by the following conditions:

(1) CSPs are leadless and, with a few exceptions, their assemblies do not have much compliance built-in. Compliancy helps relieve solder joint stresses as shown with packages having tall leads.
(2) Their effective coefficient of thermal expansion (CTE) tends to be low because of high silicon content. Many CSPs are not well CTE-matched to organic boards.
(3) Assembled packages feature a low standoff for miniaturization purposes. This factor increases cyclic strains in solder joints.
(4) Flip chip and CSP solder joints have smaller load bearing or crack propagation areas than conventional assemblies, implying higher stresses and shorter crack propagation times.
(5) Flip chip assemblies also suffer from competing failure modes, such as die cracking and underfill delamination.

The above concerns are supported by thermal cycling results, which suggest that many flip chip and CSP assemblies are less reliable than Plastic Ball Grid Arrays (PBGAs). For example, PBGAs on FR4 boast a median life of 5,000-10,000 cycles during thermal cycling between 0° C. and 100° C. Under similar conditions, most CSP assemblies offer median lives in the range of 1,000-5,000 cycles, with some as low as 5-100 cycles.

The poor reliability of the solder joint of CSPs is primarily due to the small size of its solder joints. For identical chips in flip-chip/CSP or BGA formats, the joint-to-height ratio ranges from about 1:5 to 1:6, which implies that shear strains in flip-chip/CSP solder joints are perhaps 6.25 times higher than in BGA assemblies. Using the Coffin-Manson relationship for solder joint life estimates, the strain ratio results in a fatigue life ratio of about 40. Furthermore, the ability to absorb energy of solder joints in flip-chip/CSPs is less than that of the BGA package.

U.S. Pat. No. 5,396,403, which is assigned to Hewlett-Packard Company and is entitled "Heat Sink Assembly with Thermally-Conductive Plate for a Plurality of Integrated Circuits on a Substrate," discloses an improved structure for heat dissipation in a multi-chip module (MCM) device where a number of chips are mounted via solder balls without imposing mechanical stress.

Figure 1:
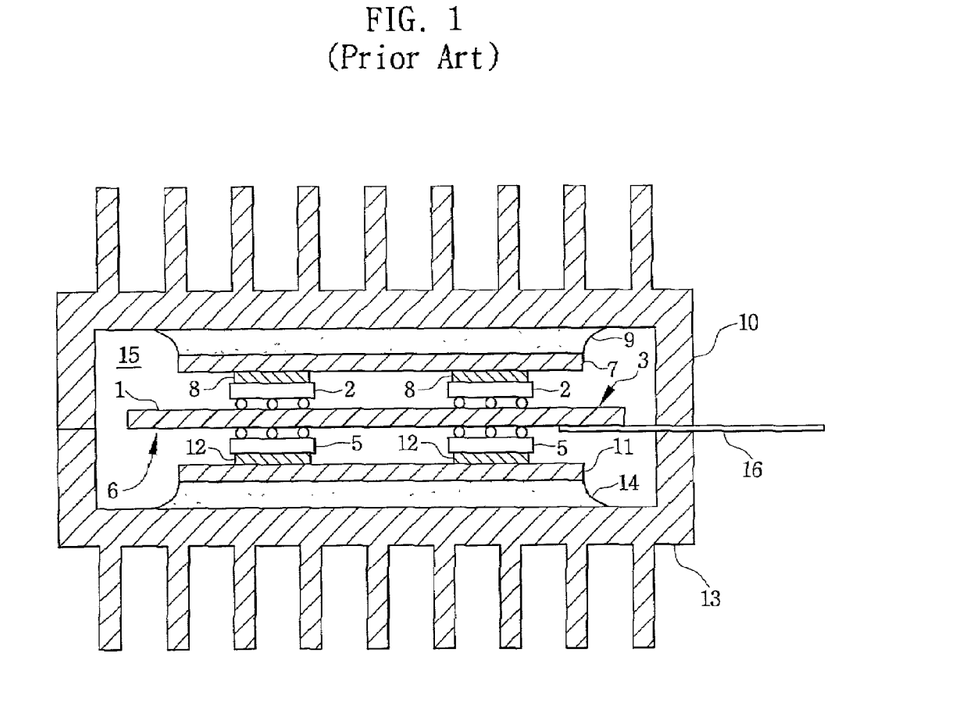
FIG. 1 illustrates a conventional heat dissipation structure in a multi-chip module.

FIG. 1 shows the conventional heat dissipation structure disclosed in U.S. Pat. No. 5,396,403. The conventional MCM heat dissipation structure includes a substrate 1 that has one or more chips 2 on an upper surface 3 and more chips 5 on a lower surface 6. The upper chips 2 are thermally coupled to a first thermally conductive plate 7 through a first thermal interface 8. The first plate 7 is thermally coupled to a first heat sink 10 through a second thermal interface 9. Similarly, the lower chips 5 are thermally coupled to a second thermally conductive plate 11 through a third thermal interface 12, and the second plate 11 is thermally coupled to a second heat sink 13 through a fourth thermal interface 14.

The first and second heat sinks 10 and 13 enclose the MCM and the two thermally conductive plates 7 and 11 in a cavity 15. The heat sinks 10 and 13 are mechanically fastened together by screws or other fasteners. A flat cable 16 extends between the heat sinks to establish electrical connections with external circuitry.

In this conventional MCM heat dissipation structure, the heat sink assembly provides an efficient, thermally conductive path between the chips in the MCM and the heat sinks in the MCM. Further, mechanical stresses from lateral chip motion resulting from thermal effects, such as differential expansion are minimized and other mechanical stresses are eliminated.

However, as CSP and flip chips are miniaturized, the solder joints become increasingly smaller, which increases the need for improving and enhancing the reliability of the solder joints.

SUMMARY OF THE INVENTION

In one embodiment of the invention, a multi-chip package is provided. The multi-chip package includes a plurality of semiconductor chips, a substrate electrically coupled to the plurality of semiconductor chips, heat dissipation means, and a plurality of thermal interfaces disposed between the semiconductor chips and the heat dissipation means. The heat dissipation means forms a hermetically sealed cavity that encloses the semiconductor chips and at least a portion of the substrate.

In another embodiment of the invention, a circuit board is provided. The circuit board includes a chip mounting surface, a chip mounting area on the chip mounting surface, the chip mounting area including a plurality of lands, and heating elements connected to the lands, the heating elements capable heating a joint formed between the lands and electrode pads of a semiconductor chip.

These and other features, and advantages, will be more clearly understood from the following detailed description taken in conjunction with the accompanying drawings. It is important to point out that the illustrations may not necessar-

BRIEF DESCRIPTION OF THE INVENTION

DETAILED DESCRIPTION

Figure 2:
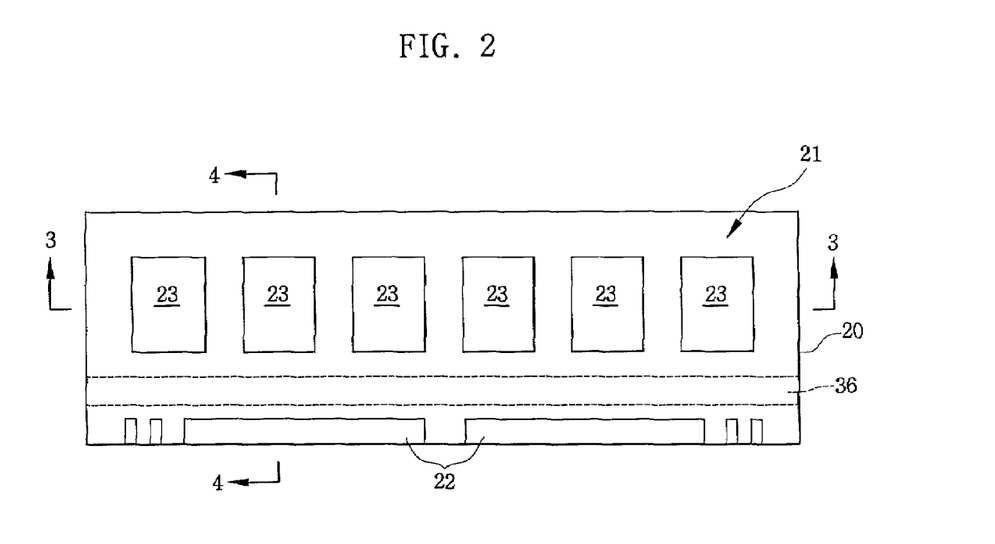
FIG. 2 is a plan view of a substrate adapted to be used in a multi-chip package according to the present invention.

FIG. 2 is a plan view of a substrate 20 suitable for use in a multi-chip package according to the present invention. The substrate 20 includes a mounting surface 21 for a plurality of semiconductor chips. The substrate 20 supports the multi-chip package and is used to electrically connect the multi-chip package to external circuitry (not shown). The substrate 20 can be an organic board, such as FR-4 board. Chip mounting areas 23 are formed on the mounting surface 21 of the substrate 20. Terminal sections 22, which electrically connect the substrate 20 with external circuitry (not shown), are also formed on the mounting surface 21 of the substrate 20. The substrate can be two-sided so that the mounting density of the multi-chip package can be increased.

In some embodiments, the chip mounting surface 21 includes electrically conductive land patterns (not shown) and wiring patterns (not shown). The wiring patterns extend from the chip mounting areas 23 to the terminal sections 22. Part or all of the wiring patterns can be formed within the substrate 20. The land patterns and the wiring patterns are used to electrically connect semiconductor chips, which are subsequently mounted in respective chip mounting areas 23, to the terminal sections 22. A hermetic seal can be formed at region 36 of the mounting surface as explained in detail below.

Figure 3:
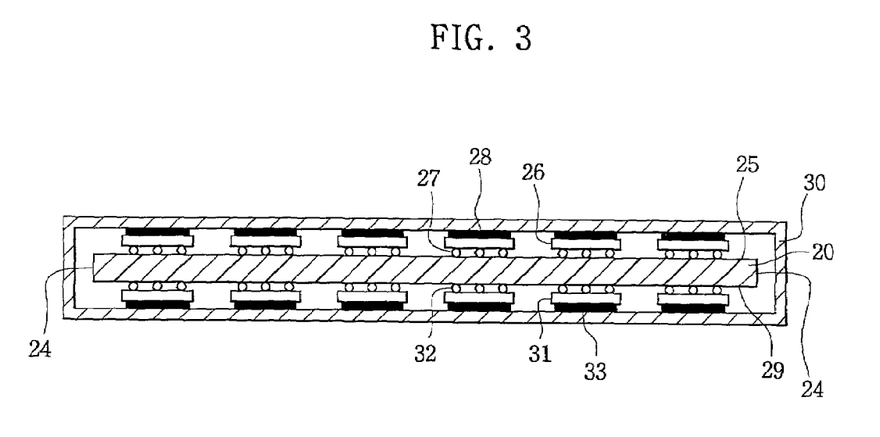
FIG. 3 is a cross-sectional view taken along a line 3-3 in FIG. 2 and shows a multi-chip package that has semiconductor chips mounted and heat dissipation means formed on a circuit substrate according to the present invention.

FIG. 3 is a cross-sectional view taken along a line 3-3 in FIG. 2 and shows a multi-chip package that has semiconductor chips 26 and 31 mounted on a circuit substrate 20 according to the present invention. Chips 26 are mounted on chip mounting areas 23 of an upper mounting surface 25 of the substrate 20 through an electrical connection means 27, such as solder balls or solder bumps. Similarly, chips 31 are mounted on chip mounting areas of a lower mounting surface 29 of the substrate 20 via an electrical connection means 32, such as solder balls or solder bumps. The upper chips 26 are connected to a heat dissipation means 30, such as a heat sink or a heat spreader through a first thermal interface 28. Similarly, the lower semiconductor chips 31 are connected to the heat dissipation means 30 through a second thermal interface 33. The heat dissipation means 30 may have a smooth surface or have multiple protrusions formed therein to increase its surface area and thus its thermal contact surface.

Figure 4:
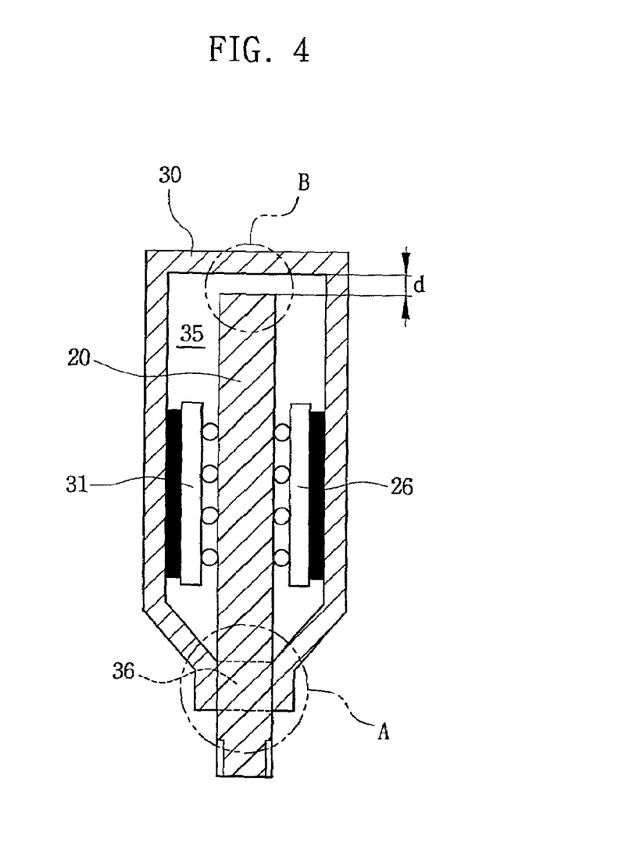
FIG. 4 is a cross-sectional view taken along a line 4-4 in FIG. 2 and shows a multi-chip package that has semiconductor chips mounted and heat dissipation means formed on a circuit substrate according to the present invention.

FIG. 4 is a cross-sectional view taken along a line 4-4 in FIG. 2 and shows a multi-chip package that has semiconductor chips 26 and 31 mounted on a circuit substrate 20 according to the present invention. As shown in FIGS. 3 and 4, the heat dissipation means 30 directly contacts the substrate 20 only at region 36 and forms a hermetically sealed cavity 35 enclosing the semiconductor chips 26 and 31 and the chip mounting surface 21 of the circuit substrate 20. The hermetically sealed cavity 35 isolates the semiconductor chips 26 and 31 from the outer atmosphere. The cavity 35 can be evacuated or filled with an inert gas, such as nitrogen, helium and/or neon gases.

The hermetically sealed cavity 35 suppresses the generation and development of solder joint cracks by preventing the oxidation of cracks that have generated. The solder joint cracks occur when the distance between neighboring molecules increases by an external force so that the attractive force between the molecules decreases. In this case, oxygen can break and intrude the molecular bond of the solder joint so that oxidation layers and cracks are generated. By blocking the supply of oxygen that is essential to the crack generation by hermetically sealing the semiconductor chips 26 and 31 and the chip mounting surface 21 of the circuit substrate 20, the generation and development of the cracks can be prevented.

Figure 7:
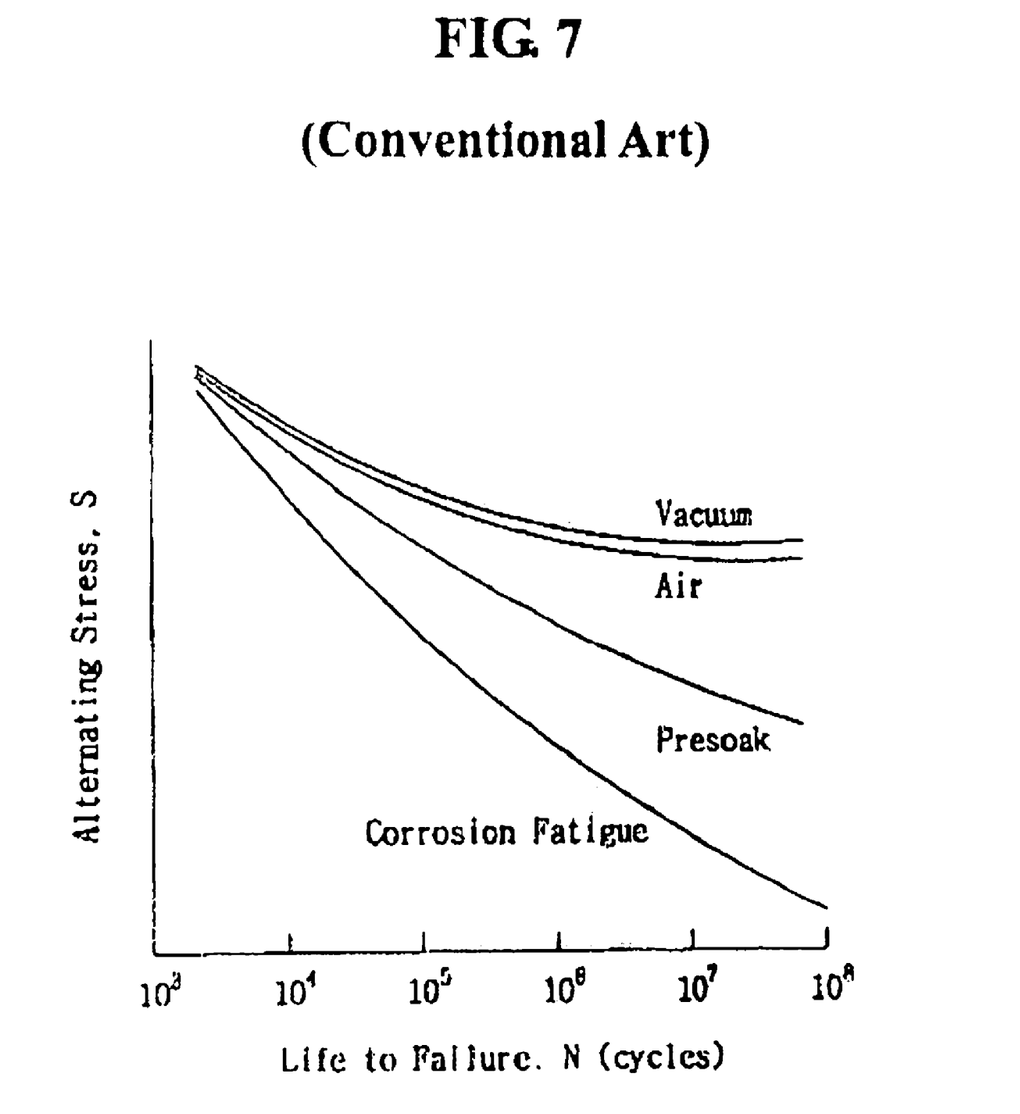
FIG. 7 is a graph for showing the difference of fatigue life depending on various environments.

Additionally, the hermetically sealed cavity 35 can prevent corrosion problems by isolating the inner space of the multi-chip package from a polluted external atmosphere. As shown in FIG. 7, fatigue life of a metal is generally increased in a vacuum environment. The graph in FIG. 7 is disclosed in an article authored by H. O. Fuchs and R. I. Stephens entitled "Metal Fatigue in Engineering," John Wiley and Sons, New York, 1980." The graph shows the variation of a S-N curve for steel in various environments. When identical stress is applied, the fatigue life of steel exhibits most excellent result in a vacuum environment.

In the multi-chip package of the present invention, the heat dissipation means 30 physically contacts the substrate 20 in a limited region. In other words, as shown in FIG. 3, a short side 24 of the substrate 20 is not connected to the inner wall of the heat dissipation means 30. Further, as shown in a circle "B" in FIG. 4, the heat dissipation means 30 is separated from the top side of the substrate 20 by a constant distance "d". In this arrangement, the effect of the heat dissipation means 30 (due to thermal expansion or contraction) on the substrate 20 is minimized and thus the reliability of solder joints is improved. For example, if the heat dissipation means 30 is made of aluminum, its coefficient of thermal expansion (CTE) is about 17-19 ppm, which is greater than the CTE of the semiconductor chips, which have a CTE of about 2.6 ppm. Additionally, the heat dissipation means 30 has greater stiffness than FR4 substrate, which has a CTE of about 18 ppm. Therefore, the aluminum heat dissipation means can greatly affect the semiconductor chips and the substrate.

The heat dissipation means 30 is formed such that a hermetic seal is made at the region 36. This can be accomplished by gradually down-bending one end portion of the heat dissipation means 30 toward the hermetic seal region 36 as shown by a circle "A" in FIG. 4 and illustrated in a perspective view in FIG. 5.

Figure 5:
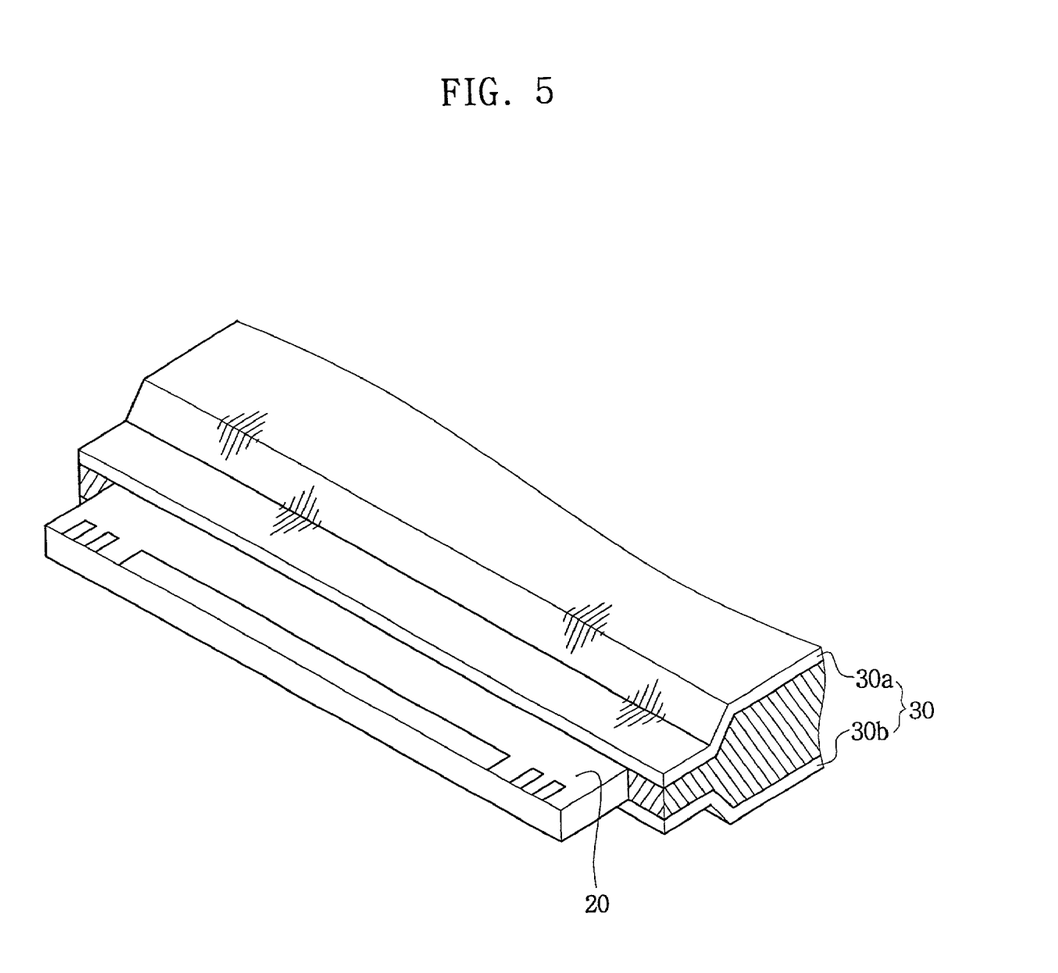
FIG. 5 is a partial perspective view of a multi-chip package according to the present invention.

Various techniques can be used to hermetically seal if the substrate 20 using the heat dissipation means 30. For example, as shown in FIG. 5, an upper heat dissipation element 30a and a lower heat dissipation element 30b both having bent ends can contact the substrate 20 and a hermetic adhesive 38 (not shown) can fill the space between the upper and lower heat dissipation elements 30a and 30b. This polymer bonding technique, where a hermetic adhesive structure having an adhesive deposited on both ends of a template spacer, can be used to maintain a certain amount of space between the two heat dissipation elements 30a and 30b. The hermetic seal achieved by this polymer bonding technique has advantages in that the substrate 20 and the heat dissipation means 30 can be bonded relatively easily and at a low cost. Further, this polymer bonding technique can be performed at a low temperature (e.g., less than or equal to 150° C.) and the resulting bond strength is very high at room temperature. However, this polymer bonding technique has a free volume in nature, and thus it may be advantageous to use other polymer bonding techniques to further improve the reliability of the bonding.

Other polymer bonding techniques include anodic bonding, low-temperature glass bonding, and fusion bonding. Anodic bonding utilizes electrostatic energy generated by applying 200-1,000 V at 180-500° C. to objects to be bonded, and typically uses a vacuum anodic bonding apparatus. Low-temperature glass bonding is carried out by either applying a pressure of 10 Kg/cm$^2$ under vacuum atmosphere with using SOG (Spin-On Glass) as an adhesive or by applying 400-450° C. by making use of a silver-filled glass adhesive.

Figure 6A:
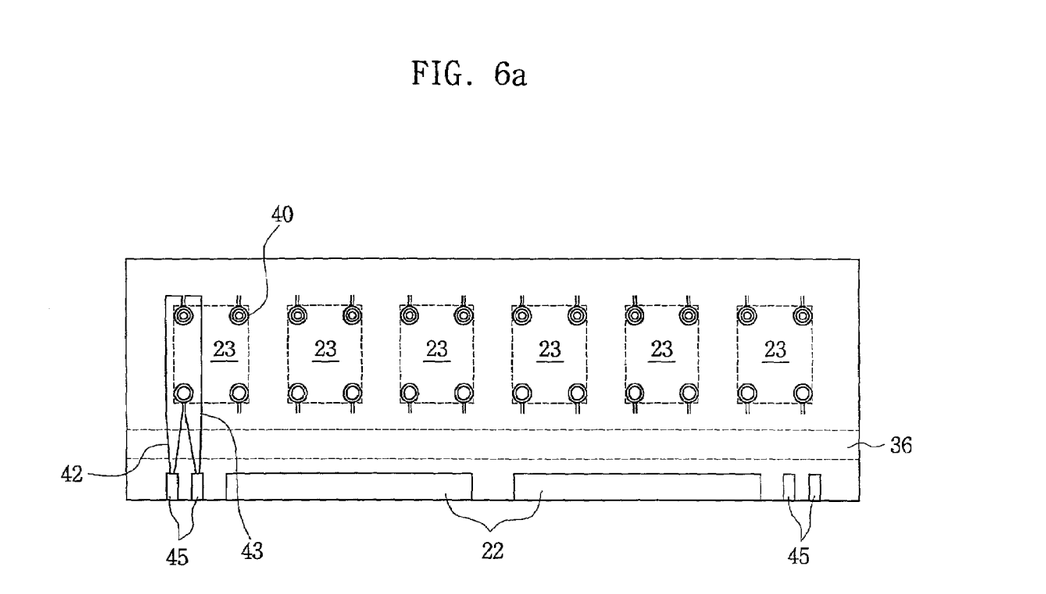
FIG. 6a is a plan view and a partially enlarged view of a board and FIG. 6b illustrates the structure of lands formed on a substrate.
Figure 6B:
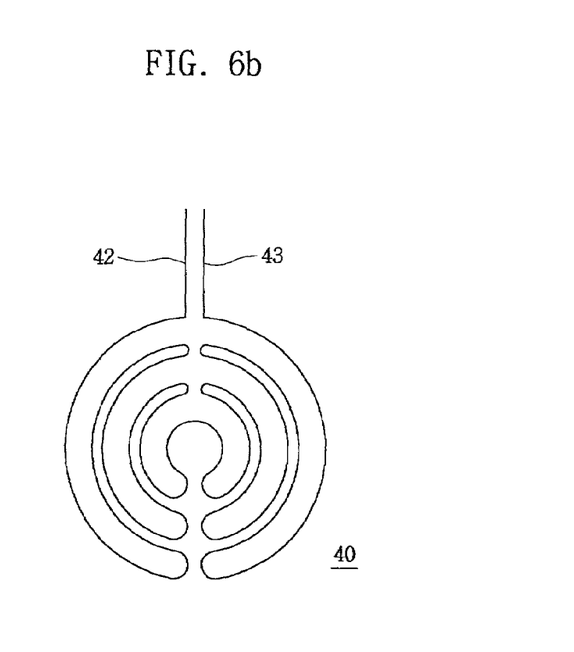

FIG. 6a is a plan view and a partially enlarged view of a board, and FIG. 6b illustrates the structure of lands formed on a substrate. The lands include heating means 40. Electrical connection means, such as solder balls, are attached to the lands 23 and are used to electrically connect the semiconductor chips to the substrate. The semiconductor chips are mounted to the lands so that their electrode pads are electrically connected to the lands. The heating means 40 formed in the lands are used to heal or recover the cracks in solder joints by heating the cracks. The heating means 40 may be formed by a spiral shaped chromium or nickel wire.

The heating means 40 are connected to external terminals 45 through the first and second wires 42 and 43. When a DC voltage is applied to the external terminals 45, the heating means 40 generate heat due to their electrical resistance. The level of DC voltage is set so that the solder balls can be melted from the heat generated by the heating means 40. The voltage supplied to the heating means 40 may be controlled externally. For example, when a semiconductor chip mounted on the substrate does not work, the DC voltage is applied to the terminals 45 of the substrate. The DC voltage can be supplied automatically by using a computer program. When the heating means 40 heats the solder balls to a temperature that is higher than melting point of the solder balls, the solder balls having cracks melt away and reflow to heal the cracks. Therefore, the reliability of the solder joints can be greatly improved and quick and easy rework of failed components is possible because there is no need to disassemble the module.

The present invention can be applied to a multi-chip package implemented by using a circuit substrate and CSPs or wafer level packages. However, it should be noted that the hermetic sealing structure and the formation of the heating means are not necessarily limited to the CSPs and WLPs and may be applied to various packages having solder joints. In the drawings and specification, there have been disclosed typical preferred embodiments of this invention and, although specific terms are employed, they are used in a generic and descriptive sense only and not for purposes of limitation, the scope of this invention being set forth in the following claims.

What is claimed is:

1. A multi-chip package comprising:
    a substrate having a first surface, a second surface opposing the first surface, and side surfaces, the side surfaces are substantially perpendicular to the first and second surfaces;
    a plurality of semiconductor chips electrically coupled to at least one of the first surface and the second surface of the substrate;
    a heat dissipater thermally coupled to a portion of the first surface and a portion of the second surface of the substrate, the heat dissipater forming a hermetically sealed cavity around the semiconductor chips and at least a portion of the substrate, such that the heat dissipater is not mechanically coupled to an entire portion of said first and second surfaces, the heat dissipater being separated from one of the side surfaces by a distance; and
    a plurality of thermal interfaces disposed between the semiconductor chips and the heat dissipater.

2. The multi-chip package of claim 1 wherein the substrate and the heat dissipation means only contact one another at a region where the hermetic seal is formed.

3. The multi-chip package of claim 1 wherein the hermetic seal forms a vacuum cavity around the semiconductor chips and at least a portion of the substrate.

4. The multi-chip package of claim 1 wherein the hermetically sealed cavity is filled with an inert gas.

5. The multi-chip package of claim 1 wherein the inert gas is selected from the group consisting of nitrogen, helium and neon.

6. The multi-chip package of claim 1 wherein each semiconductor chip is electrically connected to the substrate via a plurality of solder balls.

7. The multi-chip package of claim 1 wherein the substrate includes a plurality of land patterns and the land patterns include heating means.

8. The multi-chip package of claim 7 wherein the heating means is selected from the group consisting of nickel wire and chromium wire.

9. The multi-chip package of claim 7 wherein the land patterns are electrically coupled to a terminal section of the substrate and the terminal section of the substrate includes a power terminal for providing electrical energy to the heating means.

10. The multi-chip package of claim 1 wherein at least one of the semiconductor chips is mounted to the first surface of the substrate and at least another of the semiconductor chips is mounted to the second surface of the substrate.

11. The multi-chip package of claim 1 wherein at least one of the semiconductor chips is packaged in a CSP and at least another of the semiconductor chips is packaged in a WLP.

12. The multi-chip package of claim 1 wherein the heat dissipater comprises a first heat dissipation element and second heat dissipation element.

13. The multi-chip package of claim 1 wherein the substrate comprises:
    a chip mounting surface;
    at least one chip mounting area on the chip mounting surface, each chip mounting area including a plurality of lands; and
    a plurality of individual spaced apart heating elements on each chip mounting area, the heating elements being capable heating joints formed between the lands and electrode pads of a semiconductor chip.

14. The multi-chip package of claim 13 wherein the substrate further comprises: a power supply terminal connected to the heating elements.

15. The multi-chip package of claim 13 wherein the heating elements are formed by a nickel or chromium wires.

16. The multi-chip package of claim 13 wherein the heating elements are formed by a nickel or chromium wires having a spiral shape.

17. The multi-chip package of claim 13 wherein the heating elements heat the joints to a temperature that is higher than the melting point of the joints.

18. The multi-chip package of claim 13 wherein the lands are electrically connected to the electrode pads of the semiconductor chip via solder balls.

19. A multi-chip package, comprising:

a substrate having a first surface, a second surface, and side surfaces;

a plurality of semiconductor chips electrically coupled to at least one of the first surface and the second surface of the substrate;

a heat dissipater thermally coupled to a portion of the first surface and a portion of the second surface of the substrate, the heat dissipater forming a hermetically sealed cavity around the semiconductor chips and at least a portion of the substrate, such that the heat dissipater is not mechanically coupled to an entire portion of said first and second surfaces, the heat dissipater surrounds one of the side surfaces to form a distance between the side surface and the heat dissipater; and a plurality of thermal interfaces disposed between the semiconductor chips and the heat dissipater.

* * * * *